(12) United States Patent
Inoue et al.

(10) Patent No.: US 6,813,163 B2
(45) Date of Patent: Nov. 2, 2004

(54) CONVERTER DEVICE

(75) Inventors: Keiji Inoue, Yokohama (JP); Yosuo Ohashi, Tokyo-to (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/209,593

(22) Filed: Aug. 1, 2002

(65) Prior Publication Data
US 2002/0186553 A1 Dec. 12, 2002

Related U.S. Application Data

(62) Division of application No. 09/920,468, filed on Aug. 1, 2001, now abandoned.

(30) Foreign Application Priority Data

Aug. 9, 2000 (JP) ........................................ 2000-241339

(51) Int. Cl.$^7$ .............................. H05K 1/11; H05K 1/14
(52) U.S. Cl. ........................ 361/784; 361/785; 361/790; 361/803
(58) Field of Search ................................ 361/769–770, 361/773–775, 776–779, 781–785, 790–792, 794–795, 803–804; 257/686, 696, 724; 439/65–75; 336/192–200

(56) References Cited

U.S. PATENT DOCUMENTS

| | | | |
|---|---|---|---|
| 3,941,442 A | | 3/1976 | Friend |
| 4,592,617 A | * | 6/1986 | Seidler ........................ 439/876 |
| 4,647,126 A | * | 3/1987 | Sobota, Jr. .................... 439/74 |
| 5,386,206 A | * | 1/1995 | Iwatani et al. ............... 336/200 |
| 5,910,885 A | * | 6/1999 | Gulachenski et al. ........ 361/774 |

FOREIGN PATENT DOCUMENTS

| | | |
|---|---|---|
| DE | 41 16 826 | 12/1991 |
| DE | 44 35 832 | 1/1996 |
| JP | 3-214578 | 9/1991 |
| JP | 8-264918 | 10/1996 |
| JP | 10-056773 | 2/1998 |
| JP | 10-098243 | 4/1998 |
| JP | 11-040425 | 2/1999 |

* cited by examiner

Primary Examiner—David A. Zarneke
Assistant Examiner—Tuan Dinh
(74) Attorney, Agent, or Firm—Keating & Bennett, LLP

(57) ABSTRACT

A plurality of converter circuits is connected in parallel while reducing conduction loss. A converter circuit is formed on each of a plurality of circuit boards, and a plurality of types of terminal connection patterns containing power input terminal connection patterns and power output terminal connection patterns are formed on the end portions of each of the circuit boards with the disposition positions substantially matching each other. The terminal connection patterns at the same position of each circuit board are sandwiched by each of clips of a common terminal member, each of the circuit boards is laminated and fixed, and the converter circuits of each of the circuit boards are connected in parallel. The conduction path for electrically connecting the converter circuit of each circuit board becomes short, making it possible to reduce conduction loss. Also, it is possible to mount a plurality of converter circuits without increasing the occupied area of a motherboard to be mated therewith in comparison with a case in which the circuit boards are provided side-by-side.

18 Claims, 8 Drawing Sheets

CROSS SECTION A-A

CONVERTER DEVICE

This application is a Divisional of U.S. patent application Ser. No. 09/920,468 filed Aug. 1, 2001, now abandoned.

BACKGROUND OF THE INVENTION

1. Field of the Invention

The present invention relates to a converter device, such as a DC-DC converter.

2. Description of the Related Art

For example, a DC-DC converter, which is one type of converter, converts an input DC voltage/current into an output DC voltage/current in accordance with specification conditions. The circuit of the DC-DC converter is constructed in such a way that, as shown in, for example, FIG. 10(b), electronic parts 46 and circuit patterns (not shown) are formed on a circuit board 45. The end portion of the circuit board 45 has a plurality of terminal members 48 formed thereon. The circuit board 45, a DC-DC converter circuit 47 formed on the circuit board 45, and the terminal members 48 constitute DC-DC converter parts 49. The DC-DC converter parts 49 are mounted on a motherboard 50 to be mated therewith, and the DC-DC converter circuit 47 is electrically connected to a circuit formed on the motherboard 50 via the terminal members 48.

There are cases in which a plurality of DC-DC converter parts 49 such as those described above are used to deal with a request for the output voltage/current according to the specification conditions. In this case, for example, as shown in FIG. 10(a), the plurality of DC-DC converter parts 49 are disposed side-by-side on the motherboard 50 with a spacing D therebetween, and these plurality of DC-DC converter parts 49 are connected in parallel by conduction patterns 51 formed on the motherboard 50 according to the specifications.

However, since the conduction pattern 51 for connecting the plurality of DC-DC converter parts 49 in parallel extending on the motherboard 50 are long, there is a problem in that the conduction loss in the conduction pattern 51 is large. Also, there is the inconvenience of having to take the trouble to form the conduction pattern 51 on the motherboard 50.

Furthermore, as described above, since the plurality of DC-DC converter parts 49 are disposed beside each other with the spacing D therebetween, there is a demand for a large area for the disposition of DC-DC converter parts, corresponding to the number of DC-DC converter parts 49 which are positioned, making it difficult to reduce the size of the motherboard 50.

In addition, since a plurality of DC-DC converter parts 49 cannot be disposed side-by-side or mounted at the same time on the motherboard 50, when a plurality of DC-DC converter parts 49 are disposed side-by-side, as shown in FIG. 10(a), the plurality of DC-DC converter parts 49 must be mounted individually on the motherboard 50, which presents a problem in that the step of mounting the plurality of DC-DC converter parts 49 on the motherboard 50 takes time.

SUMMARY OF THE INVENTION

The present invention has been made to solve the above-described problems. An object of the present invention is to provide a converter device which is capable of minimizing conduction loss in connection means for connecting a plurality of converter circuits when the plurality of converter circuits (converter sections) is connected and used and, moreover, which is capable of supplying an output voltage/current appropriate to the specification conditions without increasing the occupied area on the motherboard on which the converter device is mounted.

To achieve the above-mentioned object, the present invention has the construction described below for solving the above-described problems.

In a first aspect, the present invention provides a converter device comprising: a converter section for converting an input voltage/current into a voltage/current appropriate to specification conditions and outputting the voltage/current; a plurality of circuit boards on which a power input terminal connection pattern and a power output terminal connection pattern, which are electrically connected to the converter section, are provided; and a plurality of mating members for holding and fixing these circuit boards in a laminated manner with a spacing therebetween, wherein the converter section of each of the circuit boards is formed such that the power input terminal connection patterns of each of the circuit boards are electrically connected to each other by the mating members which are common, the power output terminal connection patterns of each of the circuit boards are electrically connected to each other by the mating members which are common, and these are connected in parallel.

The invention in accordance with a second aspect comprises the construction of the first aspect of the present invention. Each converter section has a coil section, and the coil section is formed as a circuit-board-integrated-type coil section having a core member attached to a coil pattern formed on the circuit board.

The invention in accordance with a third aspect comprises the construction of the first or second aspect of the present invention. A terminal member for power output, which is a mating member for electrically connecting between power output terminal connection patterns of each circuit board, is formed such that the output current of each converter section merges and the amount of supplied current is increased, and this terminal member for power output is formed such that a current conduction path on a downstream side is made wider than a current conduction path on an upstream side so as to increase the cross-sectional area thereof.

The invention in accordance with a fourth aspect comprises the construction of the first, second, or third aspects of the present invention. Each conduction pattern for power output on a high potential side and on a low potential side of the converter section mounted on each circuit board is formed on both the obverse and reverse surfaces of each circuit board, and a plurality of power output terminal connection patterns is provided via a spacing with the end portions of each of the conduction patterns on a high potential side and on a low potential side, so that both parallel connection and serial connection of the plurality of converter sections can be dealt with by the combination of the conduction connection between the end portions of each of the conduction patterns for power output and the power output terminal connection patterns.

The invention in accordance with a fifth aspect comprises the construction of the first, second, third, or fourth aspects of the present invention. The mating member is formed such that a conduction plate member is cut and raised, a plurality of alligator clips is formed at intervals of a predetermined spacing, and each circuit board is sandwiched and fixed by each of the clips.

The invention in accordance with a sixth aspect comprises the construction of the fifth aspect of the present invention. Each alligator clip comprises a support section for supporting the circuit board such so as to be brought into abutment with one of the obverse surface and the reverse surface of the circuit board; and a pressing section for applying a pressing force to the other surface of the circuit board by using resilience, the circuit-board-abutment surfaces of the support section of each of the clips are made substantially parallel to each other, and each of the circuit boards is laminated and fixed substantially parallel to each other.

The invention in accordance with a seventh aspect comprises the construction of the fifth aspect of the present invention. A mating member for electrically connecting between the power output terminal connection patterns of each circuit board is formed so that the output current of each converter section merges and the amount of supplied current is increased, and a conduction plate member which constitutes the mating member is formed such that a current conduction path on a downstream side of the output current is made wider than on an upstream side so as to increase the cross-sectional area thereof.

In the invention having the above-described construction, each circuit board on which a converter section is formed is held by a mating member, and is laminated and fixed with a spacing therebetween. Consequently, it is possible to mount a plurality of converter sections on a motherboard without increasing the occupied area of, for example, a motherboard on which the converter device is mounted. Also, since a plurality of circuit boards is laminated and integrated, by performing a mounting operation only once, a plurality of circuit boards can be mounted at the same time on the motherboard, and less time is required for the step of mounting a converter device.

In addition, in the present invention, for the converter sections of each circuit board, the power input terminal connection patterns of each of the circuit boards are electrically connected to each other by a common mating member, and the power output terminal connection patterns of each of the circuit boards are electrically connected to each other by a common mating member, and these are connected in parallel. Consequently, there is no need to form, on a motherboard to be mated therewith, a conduction pattern for connecting a plurality of converter sections in parallel, as in the conventional way. Also, since the connection path for connecting each converter section in parallel can be shortened considerably more than a case in which a plurality of converter sections is provided side-by-side, it is easy to minimize conduction losses.

The above and further objects, aspects and novel features of the invention will become more fully apparent from the following detailed description when read in conjunction with the accompanying drawings.

BRIEF DESCRIPTION OF THE DRAWING(S)

FIGS. 1(a), 1(b), and 1(c) are diagrams illustrating a converter device according to a first embodiment of the present invention;

FIGS. 2(a) and 2(b) are illustrations showing an example of a circuit-board-integrated-type coil section;

Figure 5A:
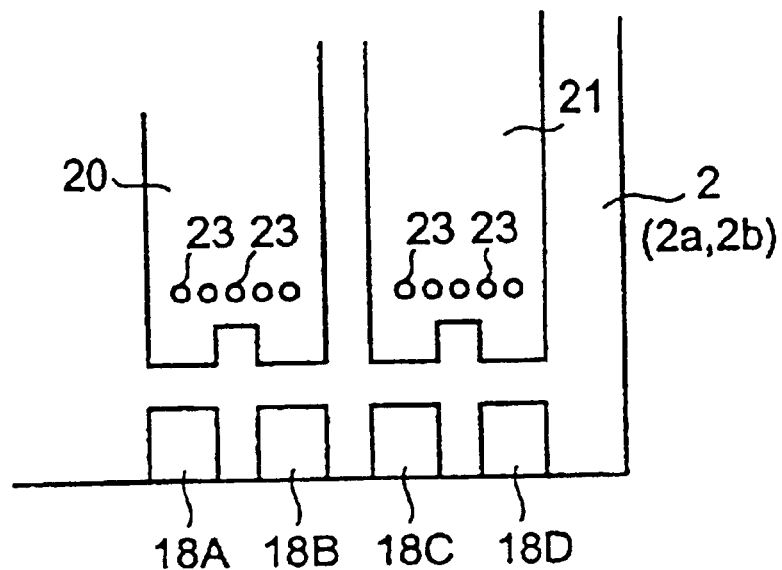
Figure 5B:
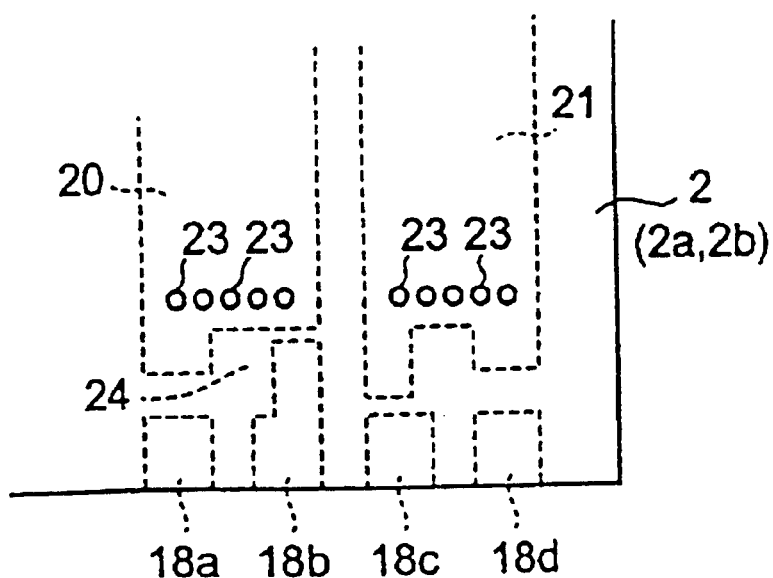
Figure 6:
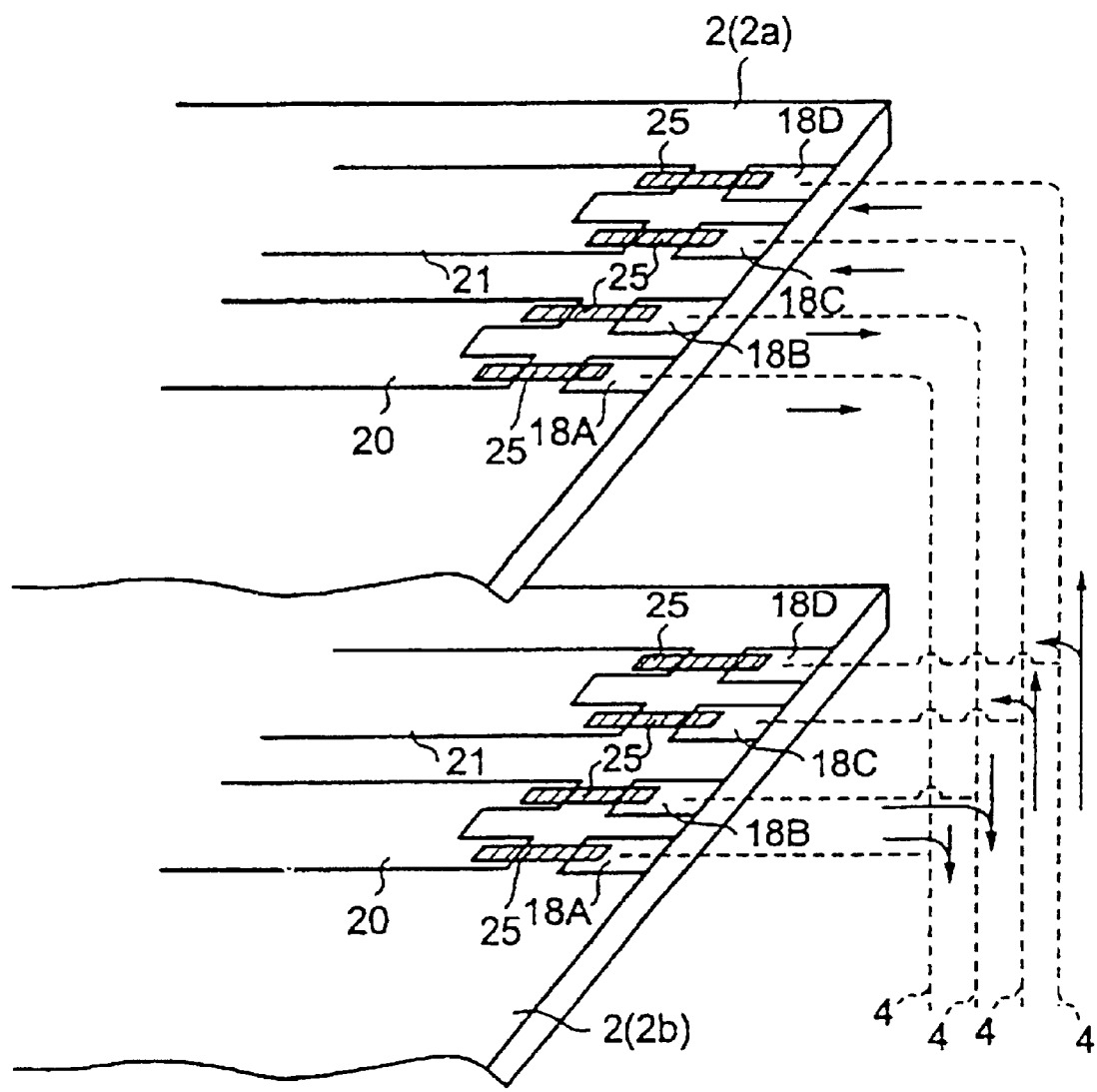
Figure 7:
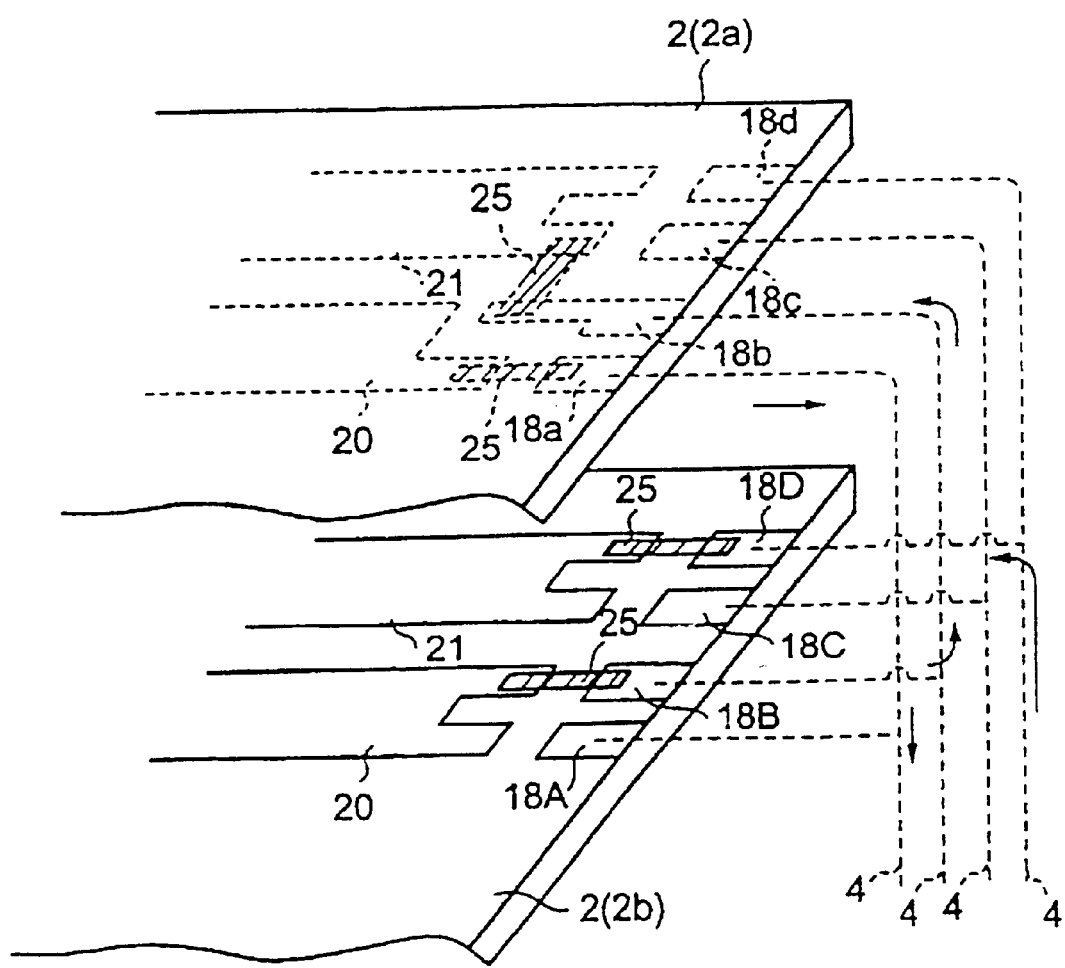
Figure 8:
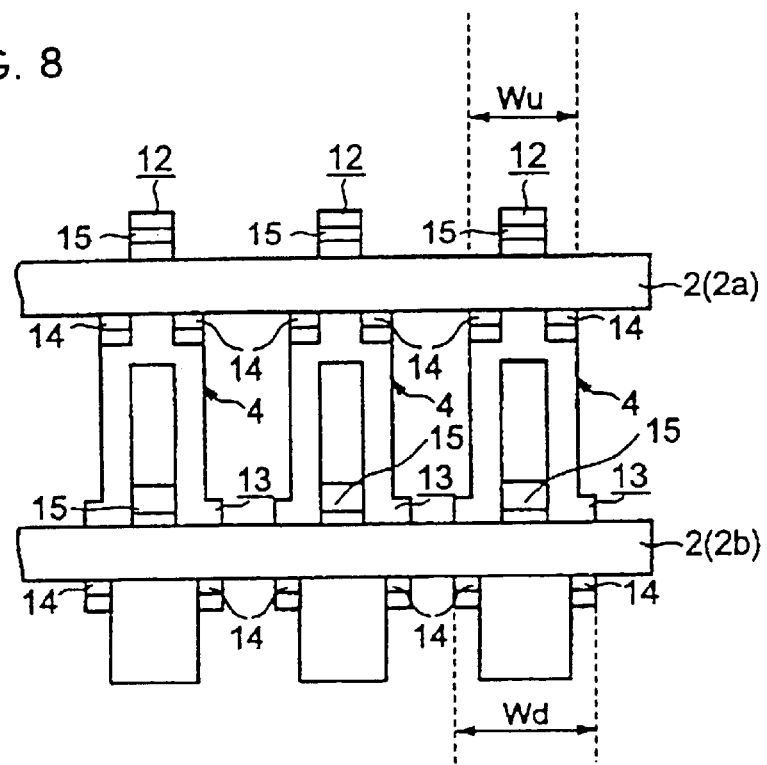
Figure 9:
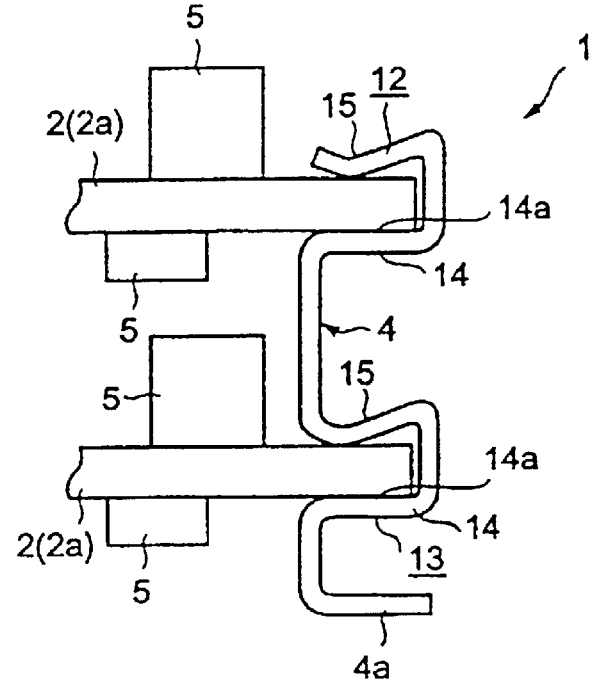
Figure 10A:
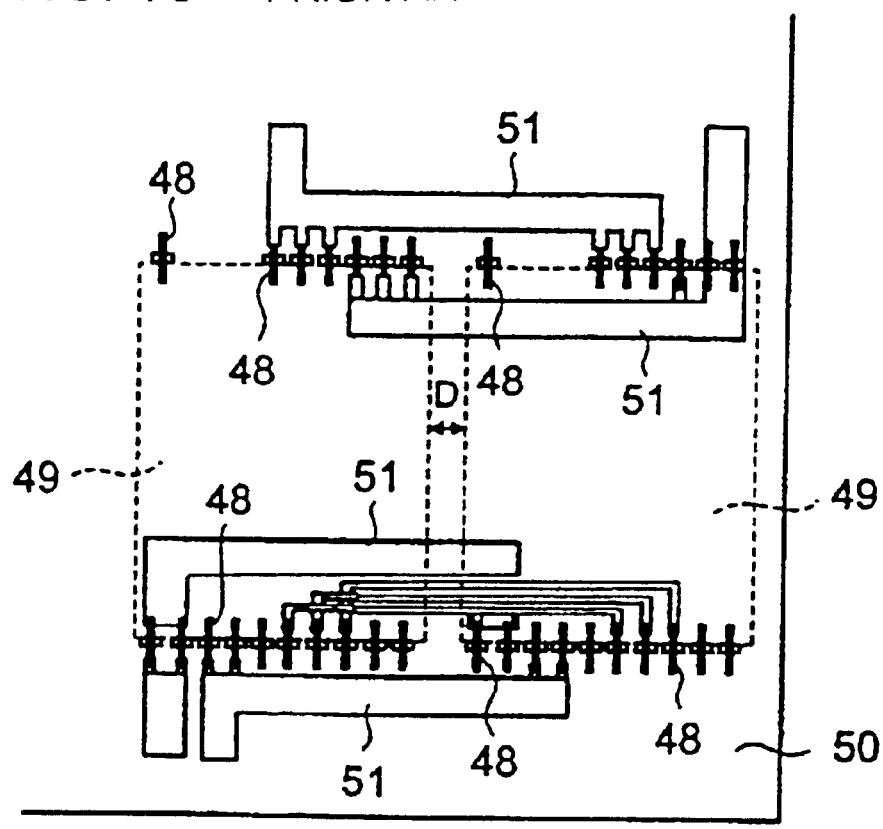
Figure 10B:
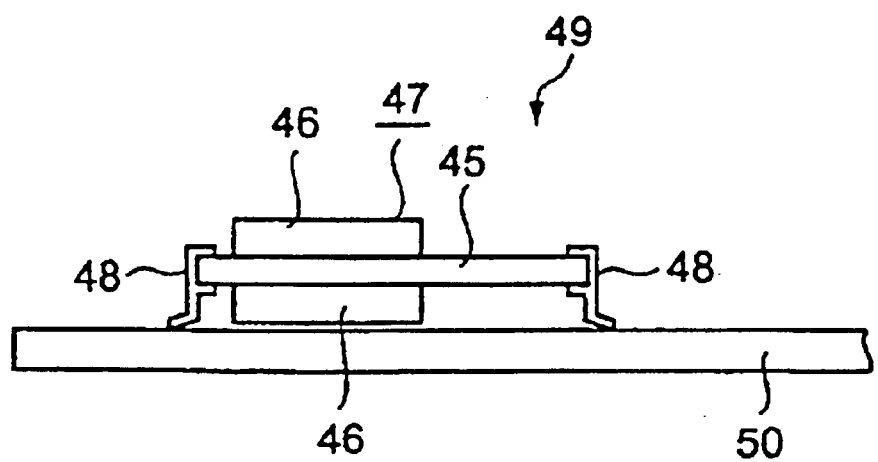

FIGS. 5(a) and 5(b) are illustrations showing examples of the shapes of a power output conduction pattern and a power output terminal connection pattern of a converter section which is a constituent of each embodiment;

FIG. 6 is an illustration showing an example of a case in which each converter section is connected in parallel by using a power output conduction pattern and a power output terminal connection pattern having the shapes shown in FIGS. 5(a) and 5(b);

FIG. 7 is an illustration showing an example of a case in which each converter section is connected in series by using a power output conduction pattern and a power output terminal connection pattern having the shapes shown in FIGS. 5(a) and 5(b);

FIG. 8 is a diagram illustrating a second embodiment of the present invention;

FIG. 9 is an illustration showing an example of another form of mating member; and FIGS. 10(a) and 10(b) are illustrations showing a conventional example.

DETAILED DESCRIPTION OF EMBODIMENTS OF THE INVENTION

The preferred embodiments of the present invention will now be described below with reference to the attached drawings.

Figure 1A:
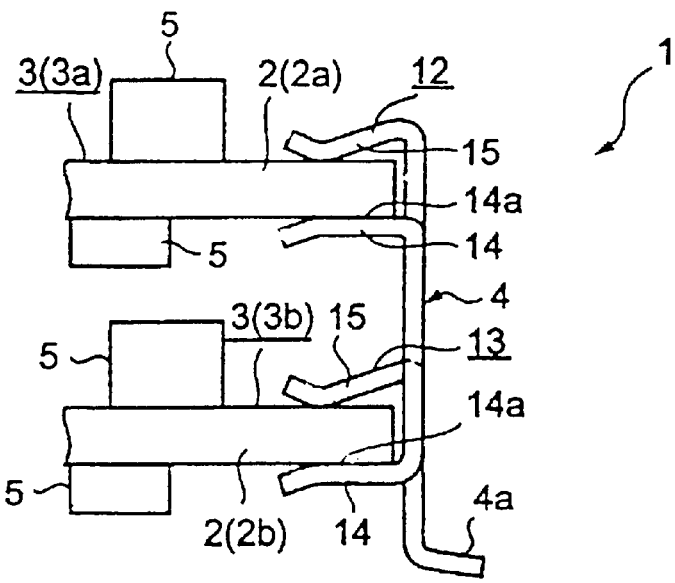
Figure 1B:
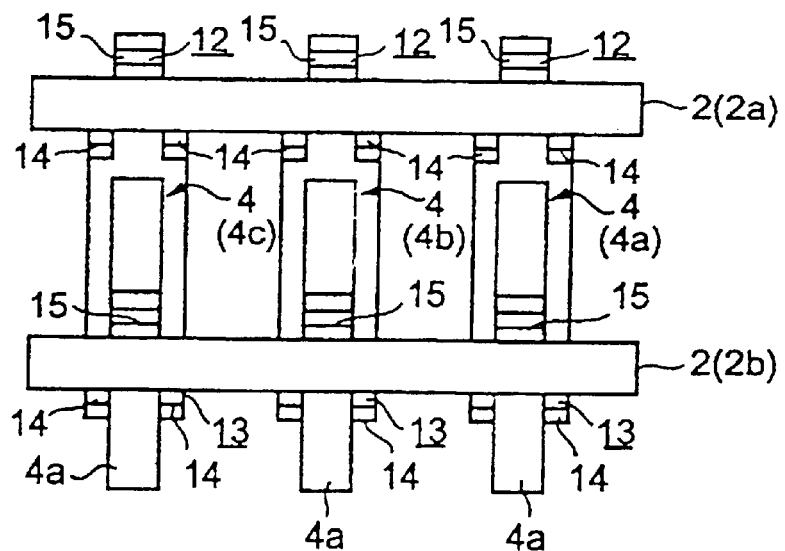

FIG. 1(a) schematically shows a part of a converter device according to a first embodiment of the present invention. FIG. 1(b) schematically shows the converter device of the first embodiment viewed from the left side in FIG. 1(a).

A converter device 1 shown in this first embodiment comprises a plurality of circuit boards 2 (2a and 2b), a DC-DC converter circuit 3 (3a and 3b) which is a converter section formed on each of the circuit boards 2, and a plurality of terminal members 4 (4a, 4b, 4c, . . . ) which are mating members by which the plurality of circuit boards 2 are mated.

An electronic part 5 and a circuit pattern (not shown) are formed on each of the circuit boards 2, thereby forming the DC-DC converter circuit 3. In this first embodiment, the DC-DC converters 3a and 3b formed on the respective circuit boards 2a and 2b have a circuit construction of the same isolation type having a transformer which is a coil section. In this first embodiment, a transformer which is a constituent of the DC-DC converter circuit 3 has a circuit-board-integrated-type form illustrated in the exploded view shown in FIG. 2(a) and in the sectional view shown in FIG. 2(b).

Figure 2A:
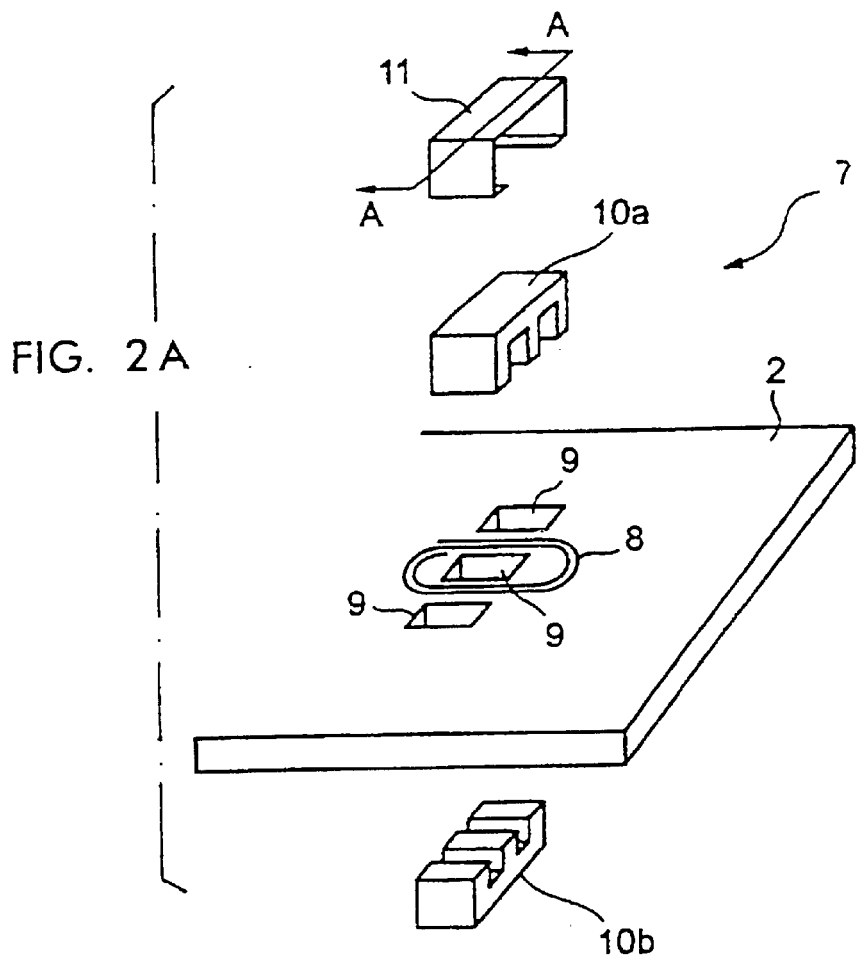
Figure 2B:
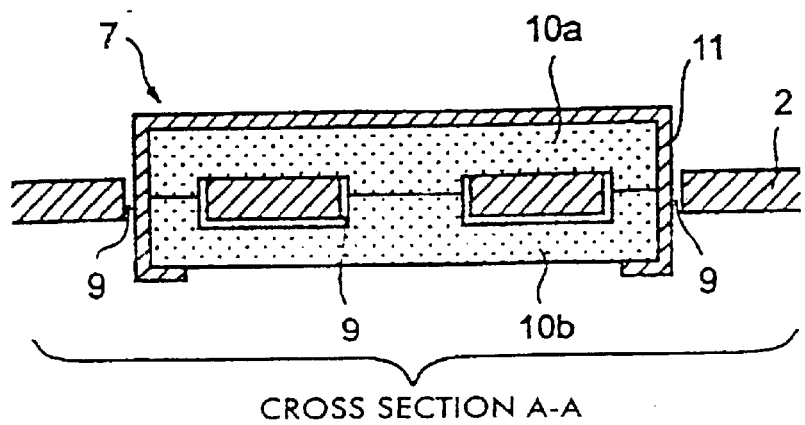

A circuit-board-integrated-type transformer 7 shown in FIGS. 2(a) and 2(b) is formed such that a pair of core members 10a and 10b are attached to a coil pattern section 8 formed on the circuit board 2 by using a core insertion hole 9 formed on the circuit board 2, and the pair of core members 10a and 10b are engaged with a core mating member 11 and are mated. The coil pattern section 8 is formed such that a coil pattern is placed on each substrate sheet (not shown) which is a constituent of the circuit board 2 which is a multilayered board with the center axes being substantially concentric.

When the DC-DC converter circuit 3 is of a feed-forward type, a choke coil which is a coil section is always provided in the DC-DC converter circuit 3. When the DC-DC converter circuit 3 is of a flyback type, a choke coil is provided in the DC-DC converter circuit 3 as necessary. In this first embodiment, when a choke coil is provided as a component part of the DC-DC converter circuit 3 in the circuit board 2, the choke coil is also formed to be a circuit-board-integrated-type form in a manner similar to the transformer 7.

Both ends of each of the circuit boards 2a and 2b on which the DC-DC converter circuit 3 is formed are held by a plurality of terminal members 4, and the circuit boards 2a and 2b are laminated and fixed with a spacing therebetween. In this first embodiment, the terminal member 4 is such that a conduction plate member is cut and raised, and a plurality of alligator clips 12 and 13 are formed at a predetermined spacing.

Each of the clips 12 and 13 comprises a support member 14 and a pressing section 15. The support member 14 abuts with one of the obverse and reverse surfaces of the circuit board 2 (the reverse surface in the example shown in FIGS. 1(a) and 1(b) so as to support the circuit board 2. The pressing section 15 applies a pressing force to the other surface of the circuit board 2 (the obverse surface in the example shown in FIGS. 1(a) and 1(b) by using resilience. Each of the clips 12 and 13 formed by the support member 14 and the pressing section 15 sandwich and fix the end portions of the circuit board 2. In this first embodiment, the circuit-board-abutment surfaces 14a of the support members 14 of each of the clips 12 and 13 are made substantially parallel with each other. For this reason, each of the circuit boards 2a and 2b which are sandwiched and held by the clips 12 and 13 respectively are laminated and fixed substantially parallel to each other.

The tip portion of the support member 14 and the tip portion of the pressing section 15 of each of the clips 12 and 13 are bent in a direction in which the diameter of the corresponding alligator-shaped opening is increased, and the spacing between the tip portions of the support member 14 and the pressing section 15 is larger than the thickness of the circuit board 2, so that an operation for causing each of the clips 12 and 13 to be engaged with the circuit board 2 is made easier.

Figure 1C:
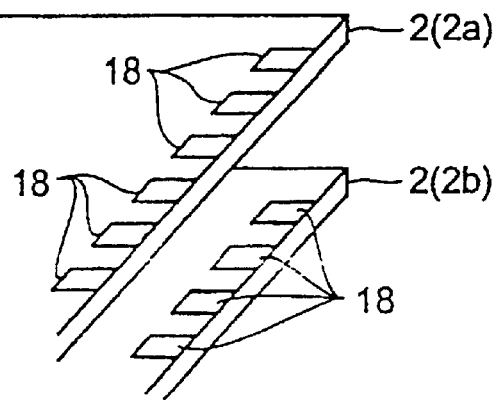

On the obverse and reverse surfaces of both end portions on each of the circuit boards 2a and 2b, as shown in FIG. 1(c), a plurality of types of terminal connection pattern 18 containing a power input terminal connection pattern, a power output terminal connection pattern, and a control signal input terminal connection pattern (to be described later) is formed with a spacing therebetween so that the disposition positions on the circuit board 2 substantially match each other. In this first embodiment, each of the plurality of terminal members 4 is fixed by sandwiching each of the circuit boards 2a and 2b so that each of the clips 12 and 13 sandwiches the terminal connection pattern 18 of the same type of each of the circuit boards 2a and 2b, and the terminal connection patterns 18 of the same type of each of the circuit boards 2a and 2b are electrically connected by the terminal member 4.

The power input terminal connection pattern is electrically connected to the conduction pattern (not shown) for power input of the DC-DC converter circuit 3, so that input power (input voltage/input current) can be externally supplied to the DC-DC converter circuit 3 through the terminal member 4 and the power input terminal connection pattern. The power output terminal connection pattern is electrically connected to the conduction pattern (not shown) for power output of the DC-DC converter circuit 3, so that output power (output voltage/output current) of the DC-DC converter circuit 3 can be externally output through the terminal member 4 and the power output terminal connection pattern. Furthermore, the control signal input terminal connection pattern is electrically connected to the conduction pattern (not shown) for control signal input of the DC-DC converter circuit 3, so that a control signal for externally controlling circuit operations, such as, for example, the starting or stopping of the driving of the DC-DC converter circuit 3, can be applied to the DC-DC converter circuit 3 through the terminal member 4 and the control signal input terminal connection pattern.

Figure 3:
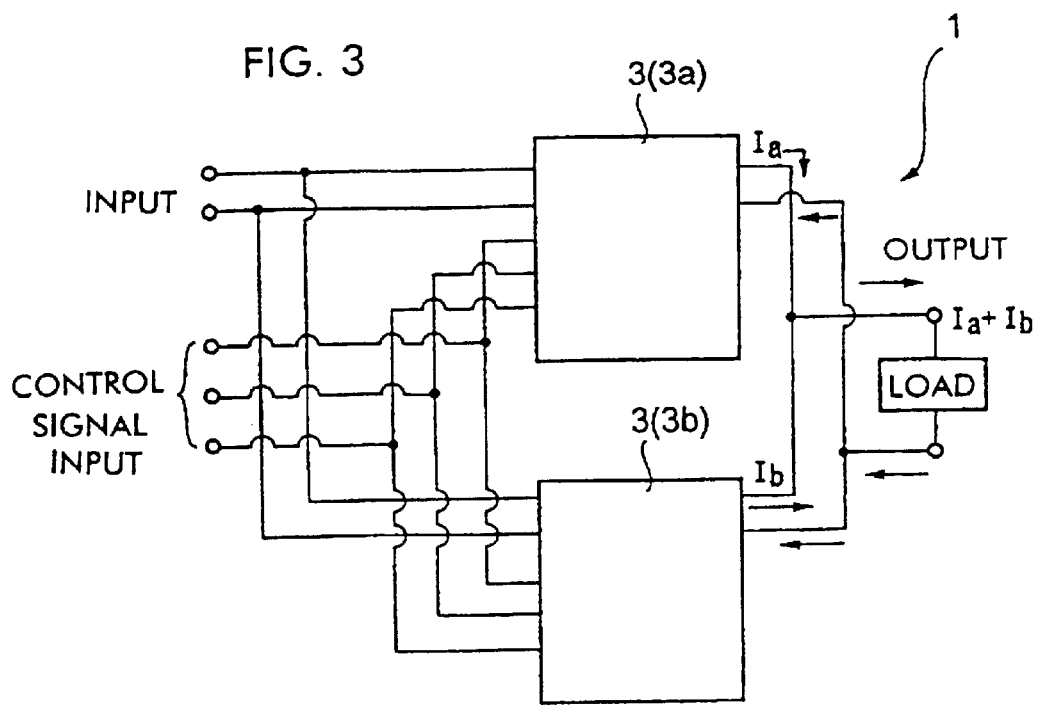
FIG. 3 is a circuit diagram in a case in which converter sections are connected in parallel.

As shown in the circuit diagram of FIG. 3, when a plurality of DC-DC converters 3a and 3b is connected in parallel, the combined current (Ia+Ib) of the output current Ia of the DC-DC converter circuit 3a and the output current Ib of the DC-DC converter circuit 3b is supplied from the converter device 1 to the load. Also, as shown in the circuit diagram of FIG. 4, when the plurality of DC-DC converters 3a and 3b is connected in series, the added voltage (Va+Vb) of the output voltage Va of the DC-DC converter circuit 3a and the output voltage Vb of the DC-DC converter circuit 3b is supplied from the converter device 1 to the load. Which one of parallel connection and serial connection the plurality of DC-DC converters 3 should take is determined according to the specification. In this first embodiment, a specific construction for enabling dealing with both the parallel connection and the serial connection is provided. That is, each of the conduction patterns on the high potential side and on the low potential side for power output of the DC-DC converter circuit 3 (3a and 3b) and the power output terminal connection pattern have a specific shape capable of dealing with both the parallel connection and the serial connection of the plurality of DC-DC converters 3.

More specifically, in this first embodiment, the conduction patterns on the high potential side and on the low potential side for power output, and the power output terminal connection pattern are formed on both the obverse and reverse surfaces of the circuit board 2 (2a and 2b). FIG. 5(a) shows an example of the characteristic pattern shape formed on each obverse surface of the circuit boards 2a and 2b. FIG. 5(b) shows an example of the characteristic pattern shape formed on each reverse surface of the circuit boards 2a and 2b.

In the examples shown in FIGS. 5(a) and 5(b), on both the obverse and reverse surfaces of the circuit boards 2a and 2b, the tip portion of a conduction pattern 20 for power output on the high potential side and the tip portion of a conduction pattern 21 for power output on the low potential side are provided side-by-side, the conduction patterns 20 on the obverse and reverse surfaces of each of the circuit boards 2a and 2b are electrically connected to each other by a through hole 23, and the conduction patterns 21 thereof are also electrically connected to each other by the through hole 23.

As shown in FIG. 5(a), power output terminal connection patterns 18A and 18B are opposedly arranged with a spacing therebetween in the tip of the conduction pattern 20 formed on each of the circuit boards 2a and 2b. Also, similarly, in the tip of the conduction pattern 21, power output terminal connection patterns 18C and 18D are opposedly arranged with a spacing therebetween. Each of the tips of the conduction patterns 20 and 21 on the obverse surface on each of the circuit boards 2a and 2b is aligned at substantially the same position, and furthermore, each of the tips of the power output terminal connection patterns 18A to 18D is also aligned at substantially the same position.

Furthermore, as shown in FIG. 5(b), power output terminal connection patterns 18a and 18b are opposedly arranged with a spacing therebetween in the tip of the conduction pattern 20 formed on the reverse surface of each of the circuit boards 2a and 2b, and similarly, in the tip of the conduction pattern 21, power output terminal connection patterns 18c and 18d are opposedly arranged with a spacing therebetween. In the tip portion of the conduction pattern 20 formed on the reverse surface of each of the circuit boards 2a and 2b, a cutout portion 24 is formed in a portion on the side near the conduction pattern 21, the power output terminal connection pattern 18b opposing this cutout portion 24 is formed to extend within the cutout portion 24, and the extension tip portion of the power output terminal connection pattern 18b is provided beside the tip portion of the conduction pattern 21.

As a result of having the specific pattern shapes shown in FIGS. 5(a) and 5(b), a combination of conduction connections between the tip portion of each of the conduction patterns 20 and 21 and the power output terminal connection patterns 18A to 18D and 18a to 18d enables either the serial connection or the parallel connection of the plurality of DC-DC converters 3 to be dealt with. More specifically, for example, when the parallel connection of the plurality of DC-DC converters 3, such as that shown in FIG. 3, is formed, as shown in FIG. 6, the conduction pattern 20 and the power output terminal connection patterns 18A and 18B formed on each obverse surface of each of the circuit boards 2a and 2b are electrically connected to each other by using a connection member 25, the resistance value of which is almost zero, such as, for example, a jumper chip, and similarly, the conduction pattern 21 and the power output terminal connection patterns 18C and 18D are electrically connected to each other by the connection member 25. In this case, none of the conduction patterns 20 and 21 formed on each of the reverse surface of each of the circuit boards 2a and 2b and the power output terminal connection patterns 18a to 18d are electrically connected.

Figure 4:
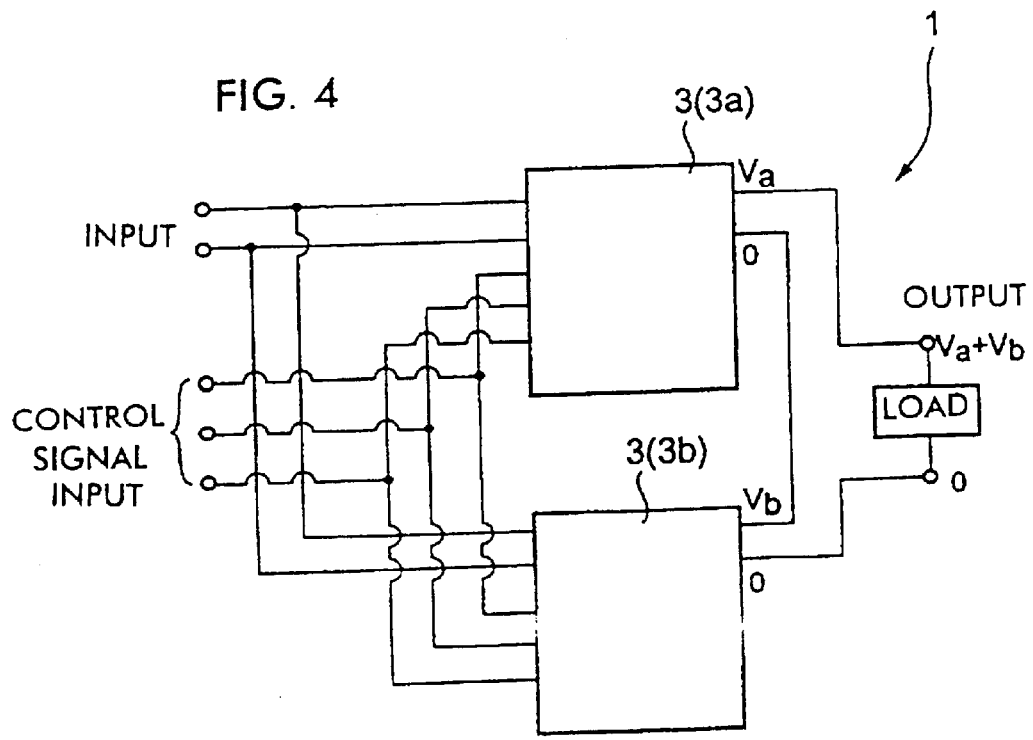
FIG. 4 is a circuit diagram in a case in which converter sections are connected in series.

When a serial connection circuit of the plurality of DC-DC converters 3, such as that shown in FIG. 4, is formed, as shown in, for example, FIG. 7, on the reverse surface of the circuit board 2a, the tip of the conduction pattern 20 is electrically connected to the power output terminal connection pattern 18a by the connection member 25, and also, the tip of the conduction pattern 21 is electrically connected to the power output terminal connection pattern 18b by the connection member 25. None of the conduction patterns 20 and 21 formed on the obverse surface of the circuit board 2a and the power output terminal connection patterns 18A to 18D are electrically connected.

Also, on the obverse surface of the circuit board 2b, the tip of the conduction pattern 20 is electrically connected to the power output terminal connection pattern 18B by using the connection member 25, and the conduction pattern 21 is electrically connected to the power output terminal connection pattern 18D by using the connection member 25. On the reverse surface of the circuit board 2b, none of the conduction patterns 20 and 21 and the power output terminal connection patterns 18a to 18d are electrically connected.

In the manner described above, as a result of connecting the terminal connection patterns 18 formed at the same position on each of the circuit boards 2a and 2b being connected together, the DC-DC converters 3a and 3b are connected in parallel or in series according to the combination of conduction connections between the conduction patterns 20 and 21 and the power output terminal connection patterns 18A to 18D and 18a to 18d.

As described above, in this first embodiment, by merely changing the combination of the conduction connections between the conduction patterns 20 and 21 and the power output terminal connection patterns 18A to 18D and 18a to 18d by changing the disposition position of the connection member 25 without changing the design of the circuit pattern of the DC-DC converter circuit 3, etc., it is possible to connect the plurality of DC-DC converters 3 in series or in parallel according to the specification conditions.

The converter device 1 shown in this first embodiment is constructed as described above and is mounted on, for example, the motherboard by using a claw portion 4a shown in FIG. 1, of the plurality of terminal members 4, so that DC-DC converter circuit 3 can be electrically connected to a circuit formed on the motherboard via the terminal member 4. In the manner described above, the supply of input power and a control signal from the motherboard to the DC-DC converter circuit 3, and the supply of output power from the DC-DC converter circuit 3 to the motherboard are performed by the terminal member 4 and the terminal connection pattern 18.

According to this first embodiment, since a plurality of circuit boards 2a and 2b on which the DC-DC converter circuit 3 is formed are laminated and fixed to form the converter device 1, it is possible to minimize the occupied area of the converter device 1 on the motherboard in comparison with a case in which a plurality of DC-DC converter parts 49 is provided side-by-side, as in the conventional way, thereby preventing an apparatus to be incorporated from being enlarged. Furthermore, since the converter device 1 having the plurality of DC-DC converters 3 can be mounted on the motherboard by one mounting operation, the time required for the mounting step can be shortened.

Moreover, in this first embodiment, since the terminal member 4 has a function for electrically connecting the same types of terminal connection patterns 18 of the circuit board 2, there is no need to provide a conduction pattern for connecting the DC-DC converter circuit 3 of each circuit board 2 on the motherboard as in the conventional way, making it possible to eliminate the work required to form a conduction pattern for connecting each DC-DC converter circuit on the motherboard.

Furthermore, as described above, in this first embodiment, since the DC-DC converters 3a and 3b are connected in series or in parallel by using the terminal member 4, the conduction path between the DC-DC converters 3a and 3b is short, making it possible to minimize conduction loss. Furthermore, since conduction loss can be minimized in such a manner, heat generation caused by the conduction loss can also be minimized.

In addition, in this first embodiment, since a plurality of DC-DC converters 3a and 3b is provided, the amount of heat generation is increased in comparison with a case in which only one DC-DC converter circuit 3 is provided. However, in this first embodiment, since the plurality of terminal members 4 function as heat dissipation members and can efficiently dissipate heat, the above-mentioned increase of the amount of heat generation does not pose a significant problem.

In addition, in this first embodiment, since the transformer, which is a constituent of the DC-DC converter circuit 3, and a coil section, such as a choke coil, provided as necessary are of a circuit-board-integrated-type, it is possible to minimize the projection of the coil section from the circuit board 2. Based on this fact, as described above, even if a plurality of circuit boards 2 are laminated, the height of the laminated body can be minimized, and it is easy to make the converter device 1 thinner.

In addition, in this first embodiment, as described above, since a specific construction capable of dealing with both parallel connection and serial connection of the plurality of DC-DC converters 3 is provided, it is possible to easily deal with both the parallel connection and the serial connection of the DC-DC converters 3 by merely changing the combination of conduction connections between each of the conduction patterns 20 and 21 for power output and the power output terminal connection patterns 18A to 18D and 18a to 18d without performing a large design change of the circuit pattern, etc. For this reason, since a circuit board 2 having a DC-DC converter circuit 3 which is specialized for parallel connection and a circuit board 2 having a DC-DC converter circuit 3 which is specialized for serial connection need not be manufactured individually, it is easy to reduce the cost of the converter device 1.

A second embodiment of the present invention will now be described below. Components with the same names in the description of the second embodiment as those of the first embodiment are given the same reference numerals, and duplicate descriptions of the common components are omitted.

A converter device 1 shown in this second embodiment has substantially the same construction as that of the first embodiment, and the features in this second embodiment are that, as shown in FIG. 8, for a conduction plate member which constitutes each terminal member 4, the width Wd on the lower side is wider than the width Wu on the upper side. The remaining construction is the same as that of the first embodiment.

When a plurality of DC-DC converters 3 is connected in parallel, the combined current of the output current of each of DC-DC converters 3a and 3b is supplied to the lower side of a terminal member 4 for power output (specifically, for example, a terminal member 4 connected to power output terminal connection patterns 18A to 18D and 18a to 18d shown in FIGS. 6 and 7), which is connected to a power output terminal connection pattern. Therefore, if the terminal members 4 for power output are at the equal width, for the lower side (the downstream side of the combined current) of the terminal member 4 for power output to which the combined output current is supplied, conduction loss is increased more than on the upper side.

Therefore, in this second embodiment, as described above, the lower side of the terminal member 4 is formed wider than the upper side, and thereby, the cross-sectional area of the current path on the lower side of the terminal member 4 is increased, so that the conduction loss on the lower side of the terminal member 4 for power output, such as that described above, is limited.

In order to limit conduction loss on the lower side of the terminal member 4 for power output, it is only necessary to cause only the terminal member 4 for power output to have a characteristic shape such as that described above. In this second embodiment, to reduce the number of types of parts, for all the terminal members 4 for which the circuit boards 2a and 2b are mated, the lower side is made wider than on the upper side, as described above. Of course, if at least the terminal member 4 for power output is formed to be the above-mentioned specific shape, that is, to be the shape in which the lower side is wider than on the upper side, an increase in the conduction loss can be limited. Consequently, only the terminal member 4 for power output may be formed with the above-mentioned specific shape, and all the terminal members 4 for which the circuit boards 2a and 2b are mated need not be formed with the above-mentioned specific shape.

According to this second embodiment, since the same construction as that of the first embodiment is provided, of course, the same effect as that of the first embodiment can be obtained. Moreover, when a plurality of DC-DC converters 3 is connected in parallel, since the lower side (that is, a portion where the combined current of the output current of each of the DC-DC converters 3a and 3b is supplied) of the terminal member 4 for power output, which is connected to the power output terminal connection pattern of each DC-DC converter circuit 3 is formed wider than on the upper side, the cross-sectional area of the current conduction path on the lower side (the lower side of the output current) of the terminal member 4 for power output, in which the combined output current is supplied, is increased, making it possible to limit an increase in the conduction loss. Furthermore, since conduction loss can be limited in such a manner, heat generation can also be limited. In addition, since the surface area on the lower side of the terminal member 4 is increased more than that of the terminal member 4 shown in the first embodiment, the amount of heat dissipation from the terminal member 4 can be increased, making it possible to improve the heat dissipation characteristics even more.

The present invention is not limited to each of the above-described embodiments, and can take various forms. For example, although in each of the above-described embodiments, the terminal member 4 is constructed so that a conduction plate member is cut and raised, and a plurality of clips 12 and 13 are formed, as shown in, for example, FIG. 9, the terminal member 4 may be manufactured such that a conduction plate member is bent, and alligator clips 12 and 13 are formed. In the example shown in FIG. 9, each of the clips 12 and 13 comprises the support member 14 and the pressing section 15 in a manner similar to each of the above-described embodiments, and the circuit-board-abutment surfaces 14a of the support members 14 of each of the clips 12 and 13 are made substantially parallel with each other. As a result, each of the circuit boards 2a and 2b are held substantially parallel with each other by the terminal member 4.

Furthermore, the terminal member 4 may be formed so as to hold a plurality of circuit boards 2 by a holding construction other than a clip construction.

In addition, although in each of the embodiments, a plurality of circuit boards 2a and 2b on which the same DC-DC converter circuit 3 is formed is mated to form the converter device 1, when, for example, it is necessary to provide a converter device 1 with an output voltage 1.9 V, the converter device 1 may be formed by combining the circuit boards 2a and 2b, each having a different DC-DC converter circuit 3, such as the converter device 1 being formed by combining a circuit board 2 having a DC-DC converter circuit 3 with an output voltage of 1 V and a circuit board 2 having a DC-DC converter circuit 3 with an output voltage of 0.9 V. In this case, if a plurality of types of circuit boards 2, in which the output voltages of the DC-DC converter circuit 3 differ from each other, is manufactured in advance, it becomes easy to instantly satisfy the output voltage according to the specification without performing design change, etc., by merely combining those circuit boards 2 according to the specification.

If the DC-DC converter circuits 3 of a plurality of circuit boards 2 which are mated in such a manner differ from each other, a plurality of types of terminal connection patterns 18 is placed on each circuit board 2 with the formation position of each circuit board 2 substantially matching each other, and similar to each of the embodiments, the same types of terminal connection patterns 18 of each circuit board 2 are electrically connected to each other by the terminal member 4.

In addition, although in each of the embodiments, the coil section, which is a constituent of the DC-DC converter circuit 3, is of a circuit-board-integrated-type, when the converter device 1 need not be thinner, the coil section need not be formed as a circuit-board-integrated-type. Furthermore, although each of the embodiments describes, as an example, a case in which the converter section is a DC-DC converter, the converter section may comprise a converter circuit other than a DC-DC converter, such as an AC-DC converter. In addition, although in each of the embodiments, the DC-DC converter circuit, which is a converter section, is of an isolation type, the converter section need not be of an isolation type which does not have a transformer.

In addition, although in each of the above-described embodiments, each of the conduction patterns 20 and 21 for power output, and the power output terminal connection patterns 18A to 18D and 18a to 18d are formed to be a specific shape capable of dealing with both parallel connections and serial connections of the DC-DC converter circuit 3, of course, each of the conduction patterns 20 and 21 for power output, and the power output terminal connection patterns 18A to 18D and 18a to 18d may be formed to be a pattern which is specialized for parallel connection or serial connection.

In addition, although in each of the above-described embodiments, the converter device 1 is constructed by laminating and fixing two circuit boards 2, the converter device 1 may be constructed by laminating and fixing three or more circuit boards 2 according to the specification.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A converter device comprising:
   a plurality of circuit boards each having a converter section for converting an input voltage/current into a voltage/current appropriate to specification conditions and output the voltage/current, a power input terminal connection pattern and a power output terminal connection pattern, the power input terminal connection pattern and the power output terminal connection pattern being electrically connected to the converter section and provided on each circuit board; and
   a plurality of first and second mating members for holding and fixing the circuit boards in a stacking manner with a spacing therebetween; wherein
   the power input terminal connection pattern of each of the circuit boards are electrically connected to each other by the plurality of first mating members, and the power output terminal connection patterns of the circuit boards are electrically connected to each other by the plurality of second mating members, said power output terminal connection patterns being thereby connected in parallel;
   each mating member is formed such that a conduction plate member is cut and raised, a plurality of alligator clips is provided at intervals of a predetermined spacing, and each circuit board is sandwiched and fixed by each of the alligator clips; and
   the second mating members connect between power output terminal connection patterns to sum the output currents of the respective circuit boards, the second mating members have cross sections larger than the others at a region where the sum of the output currents flow.

2. The converter device of claim 1, wherein each converter section has a coil section, and the coil section is formed as a circuit-board-integrated-type coil section having a core member attached to a coil pattern formed on the circuit board.

3. The converter device of claim 1, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both parallel connection and serial connection of the plurality of converter sections can be obtained by combination of a conduction connection between the end portions of each of said conduction patterns for power output and the power output terminal connection patterns.

4. The converter device of claim 2, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both parallel connection and serial connection of the plurality of converter sections can be obtained by combination of a conduction connection between the end portions of each of said conduction patterns for power output and the power output terminal connection patterns.

5. The converter device of claim 2, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both parallel connection and serial connection of the plurality of converter sections can be obtained by combination of a conduction connection between the end portions of each of said conduction patterns for power output and the power output terminal connection patterns.

6. A converter device comprising:
   a plurality of circuit boards each having a converter section for converting an input voltage/current into a voltage/current appropriate to conditions and output the voltage/current, a power input terminal connection pattern and a power output terminal connection pattern, the power input terminal connection pattern and the power output terminal connection pattern being electrically connected to the converter section and provided on each circuit board; and
   plurality of first and second mating members for holding and fixing the circuit boards in a stacking manner with a spacing therebetween; wherein
   the power input terminal connection patterns of each of the circuit boards are electrically connected to each other by the plurality of first mating members, and the power output terminal connection patterns of the circuit boards are electrically connected to each other by the plurality of second mating members, said power output terminal connection patterns being thereby connected in parallel;

each mating member is formed such that a conduction plate member is cut and raised, a plurality of alligator clips is provided at intervals of a predetermined spacing, and each circuit board is sandwiched and fixed by each of the alligator clips;

each alligator clip includes a support section for supporting the circuit board in such a manner as to be brought into abutment with one of the obverse surface and the reverse surface of the circuit board, and a pressing section for applying a pressing force to the other surface of said circuit board by using resilience, the circuit-board-abutment surfaces of the support section of each of said clips being substantially parallel to each other, and each of the circuit boards being laminated and fixed substantially parallel to each other; wherein the second mating members connect between power output terminal connection patterns to sum the output currents of the respective circuit boards, the second mating members have cross sections larger than the others at a region where the sum of the output currents flow.

7. The converter device of claim 6, wherein each converter section has a coil section, and the coil section is formed as a circuit-board-integrated-type coil section having a core member attached to a coil pattern formed on the circuit board.

8. The converter device of claim 6, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both parallel connection and serial connection of the plurality of converter sections can be obtained by combination of a conduction connection between the end portions of each of said conduction patterns for power output and the power output terminal connection patterns.

9. The converter device of claim 7, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both parallel connection and serial connection of the plurality of converter sections can be obtained by combination of a conduction connection between the end portions of each of said conduction patterns for power output and the power output terminal connection patterns.

10. The converter device of claim 6, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both parallel connection and serial connection of the plurality of converter sections can be obtained by combination of a conduction connection between the end portions of each of said conduction patterns for power output and the power output terminal connection patterns.

11. A converter device comprising:

a converter section for converting an input voltage/current which is input from an input side into an output voltage/current appropriate to specific conditions and outputting the output voltage/current from an output side;

a plurality of circuit boards on which said converter section, a power input terminal connection pattern, and a power output terminal connection pattern, which are electrically connected to the converter section, are provided; and a plurality of mating members for holding and fixing the plurality of circuit boards in a stacking manner with a spacing therebetween; wherein the input side of the converter section of each of said circuit boards is connected in parallel or is connected in series by using at least two of the mating members;

the output side of the converter section of each of said circuit boards is connected in parallel or is connected in series by using at least two of the mating members;

a mounting part for electrically connecting said plurality of circuit substrates with the circuit of a motherboard and a plurality of clips are formed in at least each mating member used for parallel connection of the input side and the output side;

the power input terminal connection pattern of each of said circuit substrates is fixed in a sandwiched manner by the clip of each mating member so that the power input terminal connection patterns are electrically connected with each other by each mating member; and the power output terminal connection pattern of each of said circuit substrates is fixed in a sandwiched manner by the clip of each mating member so that the power output terminal connection patterns are electrically connected with each other by each mating member.

12. The converter device of claim 11, wherein each of the converter sections of the plurality of circuit boards has a coil section, and the coil section is formed as a circuit-board-integrated-type coil section having a core member attached to a coil pattern formed on the circuit board.

13. The converter device of claim 11, wherein the mating members connect between power output terminal connection patterns to sum the output currents of the respective circuit boards, the mating members have cross sections larger than the others at a region where the sum of the output currents flow.

14. The converter device of claim 11, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both the parallel connection and the serial connection of the plurality of converter sections can be obtained by combination of a conduction connection between the end portions of each of said conduction patterns for power output and the power output terminal connection patterns.

15. The converter device of claim 12, wherein the mating members connect between power output terminal connection patterns to sum the output currents of the respective circuit boards, the mating members have cross sections larger than the others at a region where the sum of the output currents flow.

16. The converter device of claim 12, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both the parallel connection and the serial connection of the plurality of converter sections can be obtained by combination of a conduction connection between the end portions of each of said conduction patterns for power output and the power output terminal connection patterns.

17. The converter device of claim 13, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both the parallel connection and the serial connection of the plurality of converter sections can be obtained by combination of a conduction connection between the end portions of each of said conduction patterns for power output and the power output terminal connection patterns.

18. The converter device of claim 15, wherein each conduction pattern for power output on a high potential side and on a low potential side of the converter section mounted on each circuit board is formed on both obverse and reverse surfaces of each circuit board, and a plurality of power output terminal connection patterns are provided via a spacing with end portions of each of the conduction patterns on a high potential side and on a low potential side, so that both the parallel connection and the serial connection of the plurality of converter sections can be obtained by combination of a conduction connection between the end portions of each of said conduction patterns for power output and the power output terminal connection patterns.

* * * * *